United States Patent
Montgomery et al.

(10) Patent No.: US 11,785,819 B2
(45) Date of Patent: Oct. 10, 2023

(54) LAYERS FOR IMPROVED EXTRACTION FOR TRANSPARENT CATHODE EMISSIVE DISPLAYS

(71) Applicant: SHARP KABUSHIKI KAISHA, Sakai (JP)

(72) Inventors: David James Montgomery, Bampton (GB); Hywel Hopkin, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 301 days.

(21) Appl. No.: 17/220,349

(22) Filed: Apr. 1, 2021

(65) Prior Publication Data

US 2022/0320190 A1 Oct. 6, 2022

(51) Int. Cl.
| | |
|---|---|
| H10K 59/35 | (2023.01) |
| H10K 50/15 | (2023.01) |
| H10K 50/16 | (2023.01) |
| H10K 50/115 | (2023.01) |
| H10K 50/818 | (2023.01) |
| H10K 50/828 | (2023.01) |
| H10K 59/122 | (2023.01) |
| H10K 59/173 | (2023.01) |

(52) U.S. Cl.
CPC .......... *H10K 59/35* (2023.02); *H10K 50/115* (2023.02); *H10K 50/15* (2023.02); *H10K 50/16* (2023.02); *H10K 50/818* (2023.02); *H10K 50/828* (2023.02); *H10K 59/122* (2023.02); *H10K 59/173* (2023.02)

(58) Field of Classification Search
None
See application file for complete search history.

(56) References Cited

U.S. PATENT DOCUMENTS

| | | | |
|---|---|---|---|
| 7,091,658 B2 | 8/2006 | Ito et al. | |
| 7,902,750 B2 | 3/2011 | Takei et al. | |
| 8,207,668 B2 | 6/2012 | Cok et al. | |
| 8,894,243 B2 | 11/2014 | Cho et al. | |

(Continued)

FOREIGN PATENT DOCUMENTS

| | | |
|---|---|---|
| CN | 106876566 A | 6/2017 |
| KR | 1020150020140 A | 2/2015 |
| WO | 2017/205174 A1 | 11/2017 |

OTHER PUBLICATIONS

Lee et al., "Three Dimensional Pixel Configurations for Optical Outcoupling of OLED Displays—Optical Simulation", Proceedings SID Display Week 2019, 2019.

*Primary Examiner* — Daniel Whalen
(74) *Attorney, Agent, or Firm* — ScienBiziP, P.C.

(57) ABSTRACT

A light emitting structure comprises a substrate, a sub-pixel stack over a surface of the substrate, a bank surrounding the sub-pixel stack and forming an interior space above the sub-pixel stack, a first material filling the interior space and having a first refractive index, and a second material over the first material and having a second refractive index substantially higher than the first refractive index. The sub-pixel stack comprises an emissive layer between a first transport layer and a second transport layer, a first electrode layer coupled to the first transport layer, and a second electrode layer coupled to the second transport layer. The second electrode layer has a third refractive index substantially matched to the first refractive index.

8 Claims, 5 Drawing Sheets

(56) References Cited

U.S. PATENT DOCUMENTS

| | | |
|---|---|---|
| 9,029,843 B2 | 5/2015 | Harada et al. |
| 9,312,519 B2 | 4/2016 | Yamamoto |
| 9,583,727 B2 | 2/2017 | Cho et al. |
| 10,090,489 B2 | 10/2018 | Uchida et al. |
| 2006/0158098 A1 | 7/2006 | Raychaudhuri et al. |
| 2015/0084012 A1 | 3/2015 | Kim et al. |
| 2016/0126485 A1* | 5/2016 | Lee ........................ H10K 59/35 |
| | | 438/35 |
| 2021/0359278 A1* | 11/2021 | Kim ..................... H10K 85/631 |

* cited by examiner

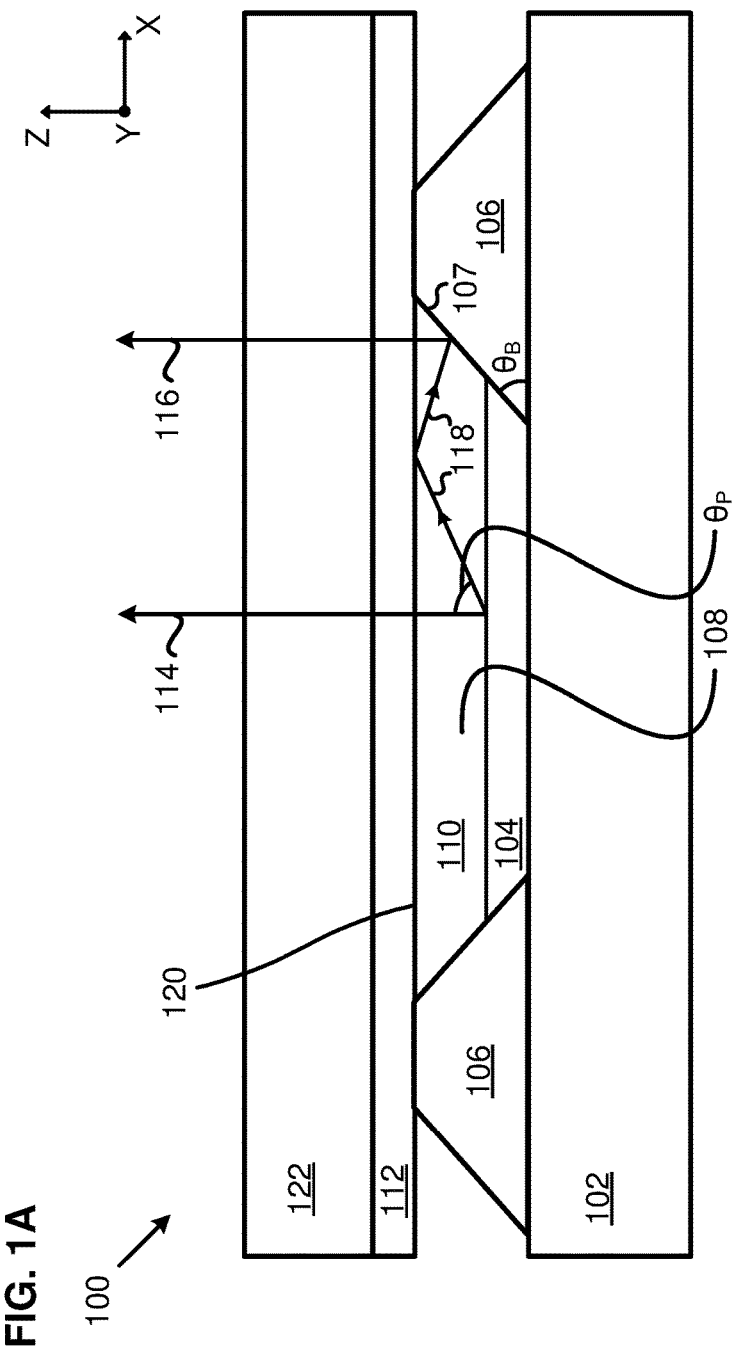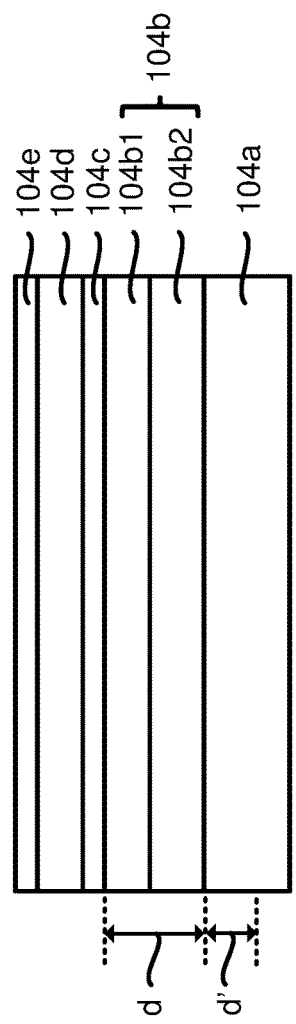

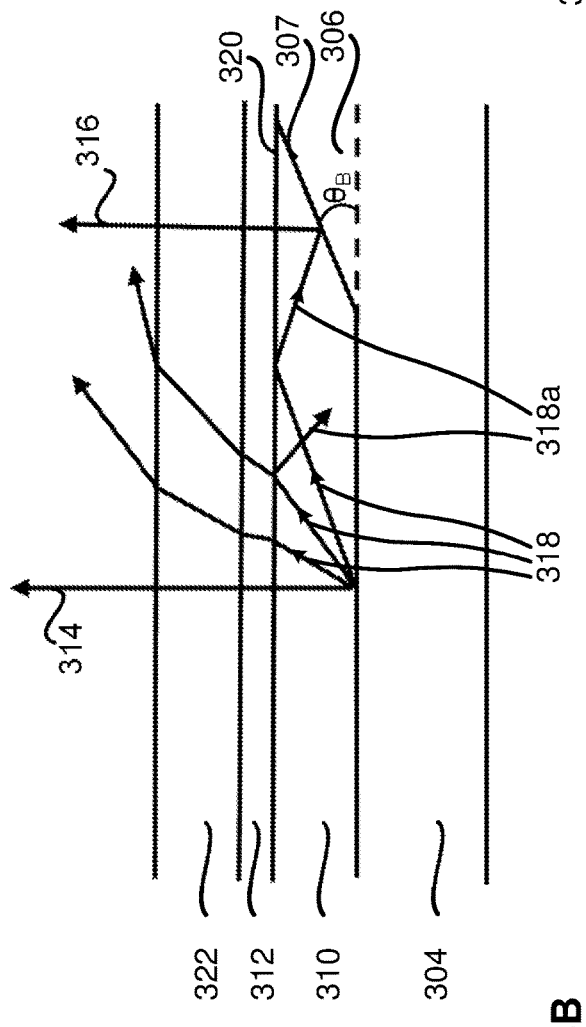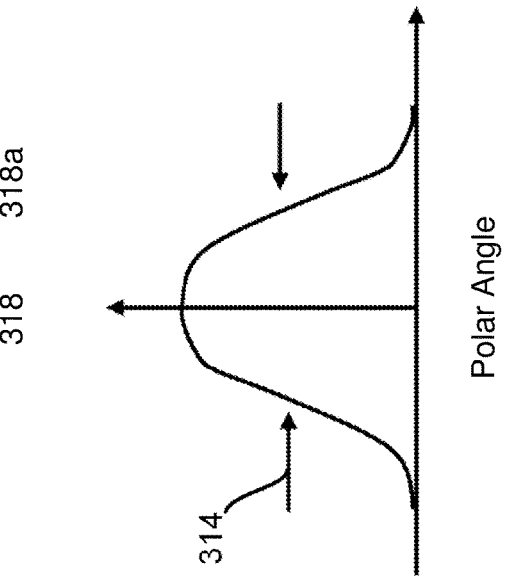
FIG. 3A
FIG. 3B

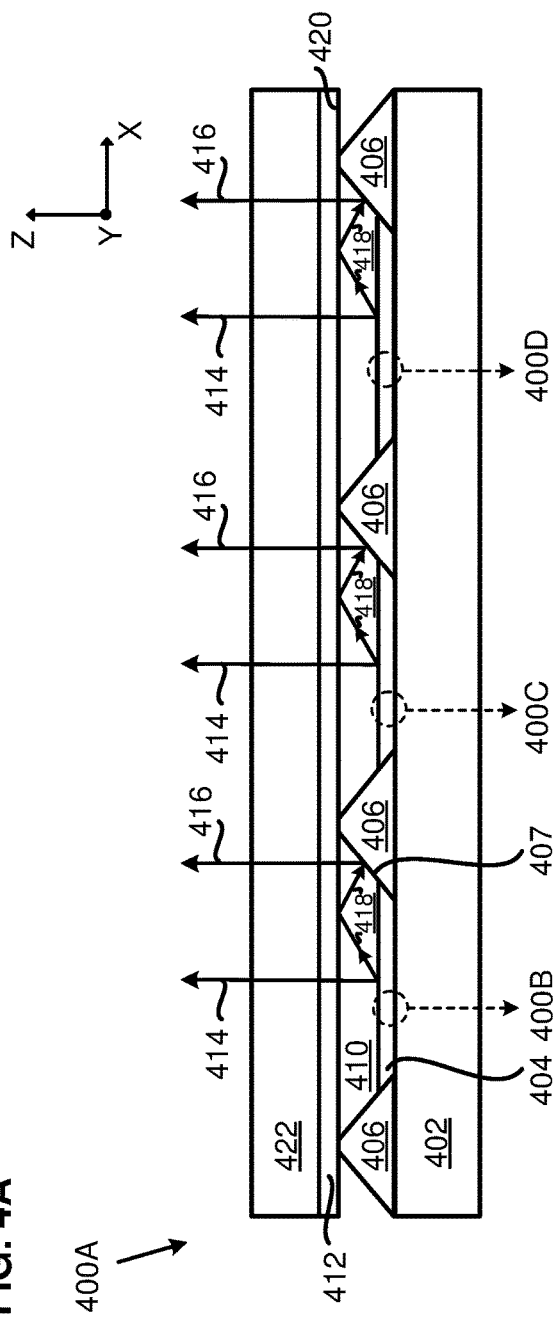

LAYERS FOR IMPROVED EXTRACTION FOR TRANSPARENT CATHODE EMISSIVE DISPLAYS

FIELD

The present disclosure is generally related to layers and bank structures used for emissive devices such as Quantum dot Light Emitting Diode (QLED) displays. In particular, the present disclosure seeks to improve efficiency, reduce colour shift, and improve on-axis brightness for a top emitting structure surrounded by a bank and including an emissive layer and a transparent cathode with a refractive index that is less than a refractive index of the emissive layer.

BACKGROUND

An Organic Light Emitting Diode (OLED) is among the most prevalent LEDs used in a display device while quantum dots are proposed as an improvement to OLEDs as they have better spectral emission and are chemically more stable. Quantum dots (QDs) are often used as phosphors for blue LEDs and exist as backlight for Liquid Crystal Displays (LCDs).

In a layered emissive display device, an emissive material (e.g., an organic dye for an OLED and quantum dots for a QLED) is sandwiched between hole transporting and electron transporting layers and electrodes. This structure operates as a diode and when current flows, electroluminescence in the emissive material creates light, and one electrode is made partially transmissive to allow light extraction. For OLEDs (and, to a lesser extent, QLEDs), the primary form of energy loss is when the light could not be extracted from the emitting structure. A typical OLED only extracts approximately 20% of the light created into air. Two key reasons for such lower percentage of light extraction are that the refractive indices of the layers in the layered emissive display device are generally quite high (e.g., a significant amount of loss by total internal reflection) and a partially reflecting electrode reflects a significant portion of light while an optical thickness of the layers between the electrodes is on the order of a wavelength, so interference is an important factor to be controlled. It should also be noted that interference, being wavelength and angle dependent, creates a shift in colour when viewed at different angles.

The design of the layered emissive structure can be optimized but there is generally a trade-off between maximizing efficiency and optimizing colour gamut range and colour shift.

Cavities and their effects on light in LED structures have long been studied. For example, Kodak (US20060158098) describes a top emitting structure and Samsung (U.S. Pat. No. 9,583,727) describes an OLED and QLED structure with light emitting regions between reflective areas, one of which is partially transmitting.

Several methods for improving the luminance of such cavities have been proposed. For example, Samsung (US2015/0084012) describes the use of dispersive layers in an OLED structure, Samsung (U.S. Pat. No. 8,894,243) describes the use of microstructure scattering to improve efficiency, and 3M (WO2017/205174) describes enhancement of light emission by use of surface plasmon nanoparticles or nanostructures in transport layers.

Methods that involve modifications to a cavity (or cavities) are often difficult to implement as they require very small size features or control of layers. One alternative to modifying the cavity is to use a thick top "filler" layer with a high refractive index, which enables reduction in Fresnel reflections and increases in transmissivity through a top electrode. However, the light in a high index layer may be mostly trapped by total internal reflection (TIR). To extract the trapped light, reflective and/or scattering banks surrounding the filler layer are used to out-couple light that is trapped by TIR.

TCL (CN106876566) and JOLED (U.S. Pat. No. 9,029,843) describe such a pixel arrangement with banks and a filler material above the organic layers of the cavity and between the banks. Hitachi (U.S. Pat. No. 7,091,658) describes banks that can be reflective using electrode metallic material, Cambridge Display Tech (KR1020150020140) describes banks that can be shaped in different structures using different assembly steps, and Sharp (U.S. Pat. No. 10,090,489) describes a shaped reflector underneath the organic layers.

Another approach is to control filler materials. For example, Global OLED (U.S. Pat. No. 8,207,668) describes filler layers that can be controlled, where the fillers and organic layers have different thicknesses for different sub pixels, in order to maximize the light output as a function of wavelength.

Another approach is to control the organic layers, which can be achieved by appropriate material choices (e.g., lyophilic/lyophobic). For example, Seiko Epson (U.S. Pat. No. 7,902,750) describes the cavity layers being curved but the encapsulation is a planarizing layer and JOLED (U.S. Pat. No. 9,312,519) describes the organic layers both being convex and concave in orthogonal directions.

In yet another approach, Lee et al. ("Three Dimensional Pixel Configurations for Optical Outcoupling of OLED Displays—Optical Simulation", Proceedings SID Display Week 2019) describes simulations of pixel bank structures with the design of an OLED emission layer. Such approach simulates optimum extraction efficiencies with bank structures that maximize efficiency for real bank structures. The optimum solution involves only green light and an Indium Tin Oxide (ITO) electrode, which would not be practical in such a device as the emission spectrum would be too broad, and thus have an inferior colour gamut while on-axis brightness (apparent brightness to the user) is not considered.

The structure described above with regard to a high index filler is optimally compatible with high refractive index emissive layers and with a high refractive index transparent top electrode (e.g., a cathode). One suitable candidate for such a cathode is ITO. However, processing of such high conductivity layers is generally aggressive and can damage other layers of the layered emissive display device. Thus, deriving a top electrode that has a high refractive index and does not degrade the other layers (e.g., emissive layers) may be a considerable challenge. Moreover, use of lower refractive index electrodes increases waveguide loss in the emissive layers and light extracted from the emissive layers is in a narrow angle range that is not subject to total internal reflection on the low index layer and, thus, does not utilize the bank. Hence, the reflected collimation and mixing of light do not occur, thus extraction is reduced significantly and colour shift becomes poor.

In one or more implementations of the present disclosure is described an alternative structure that may utilizes top electrode with a low refractive index and may allow the banks to collimate light and merge with the reflected light emitted from the emissive layers, thus improving on-axis brightness while reducing colour shift.

CITATION LIST

U.S. Pub. No. US 2006/0158098 A1 (Eastman Kodak Company, published Jul. 20, 2006).

U.S. Pat. No. 9,583,727 B2 (Samsung Display Co Ltd, issued Feb. 28, 2017).
U.S. Pub. No. US 2015/0084012 A1 (Samsung Display Co Ltd, published Mar. 26, 2015).
U.S. Pat. No. 8,894,243 B2 (Samsung Corning Precision Materials Co Ltd, issued Nov. 25, 2014).
International Pub. No. WO2017/205174 A1 (3M Innovative Properties Company, published Nov. 30, 2017).
Chinese Pub. No. CN106876566 A (TCL, published Jun. 20, 2017).
U.S. Pat. No. 9,029,843 B2 (JOLED Inc., issued May 12, 2015).
U.S. Pat. No. 7,091,658 B2 (Hitachi, issued Aug. 15, 2006).
KR1020150020140 (Cambridge Display Tech, published Feb. 25, 2015).
U.S. Pat. No. 10,090,489 B2 (Sharp Kabushiki Kaisha, issued Oct. 2, 2018).
U.S. Pat. No. 8,207,668 B2 (Global OLED Technology LLC, issued Jun. 26, 2012).
U.S. Pat. No. 7,902,750 B2 (Seiko Epson Corporation, issued Mar. 8, 2011).
U.S. Pat. No. 9,312,519 B2 (JOLED Inc, issued Apr. 12, 2016).
Lee et al. ("Three Dimensional Pixel Configurations for Optical Outcoupling of OLED Displays—Optical Simulation", Proceedings SID Display Week 2019, published 2019).

SUMMARY

The present disclosure is directed to an emissive display involving a quantum dot electro-emissive material in an LED arrangement.

In accordance with a first aspect of the present disclosure, a light emitting structure comprises a substrate, a sub-pixel stack over a surface of the substrate, a bank surrounding the sub-pixel stack and forming an interior space above the sub-pixel stack, a first material filling the interior space and having a first refractive index, and a second material over the first material and having a second refractive index substantially higher than the first refractive index. The sub-pixel stack comprises an emissive layer between a first transport layer and a second transport layer, a first electrode layer coupled to the first transport layer, and a second electrode layer coupled to the second transport layer. The second electrode layer has a third refractive index substantially matched to the first refractive index.

In one of more implementations of the first aspect, the second electrode layer includes any conductive non-metallic material. "Non-metallic" may refer to a real part of the refractive index that is significantly greater than the imaginary part (in absolute value) of the refractive index. In one example implementation, the second electrode layer includes at least one of Indium Tin Oxide (ITO) nanoparticles and silver nanowires.

In another implementation of the first aspect, the second material includes a high index transparent material including at least one of Indium Tin Oxide (ITO) and Indium Zinc Oxide (IZO).

In yet another implementation of the first aspect, the sub-pixel stack emits a first emission peak into the first material along an on-axis direction substantially normal to a top surface of the sub-pixel stack, the sub-pixel stack emits a second emission peak into the first material along an off-axis direction at an angle to the on-axis direction, and the second emission peak along the off-axis direction is reflected by an interface between the first material and the second material and directed onto a sloped sidewall of the bank.

In yet another implementation of the first aspect, the second emission peak is reflected by the sloped sidewall of the bank and emitted through the interface along the on-axis direction without substantial total internal reflection.

In yet another implementation of the first aspect, an angle between the sloped sidewall of the bank and the top surface of the sub-pixel stack is one-half an angle between the on-axis direction of the first emission peak and the off-axis direction of the second emission peak.

In yet another implementation of the first aspect, the second material covers an entire top surface of the first material.

In yet another implementation of the first aspect, the light emitting structure further comprises an air gap between the first material and the second material.

In yet another implementation of the first aspect, the emissive layer includes quantum dot emission material, the first transport layer includes a hole transport layer, the second transport layer includes an electron transport layer, the first electrode layer is an anode layer including a metallic reflector for reflecting the light emitted from the emissive layer, and the second electrode layer is a cathode layer including a non-metallic and substantially transparent material.

In yet another implementation of the first aspect, the emissive layer includes quantum dot emission material, the first transport layer includes an electron transport layer, the second transport layer includes a hole transport layer, the first electrode layer is a cathode layer having a metallic reflector for reflecting the light emitted from the emissive layer, and the second electrode layer is an anode layer having a non-metallic and substantially transparent material.

In accordance with a second aspect of the present disclosure, a light emitting structure comprises a substrate, a plurality of sub-pixel stacks emitting different colours over a surface of the substrate, a bank surrounding each of the plurality of sub-pixel stacks and forming an interior space above each of the plurality of sub-pixel stacks, a first material filling the interior space and having a first refractive index, and a second material over the first material and having a second refractive index substantially higher than the first refractive index. The at least one of the plurality of sub-pixel stacks comprises an emissive layer between a first transport layer and a second transport layer, a first electrode layer coupled to the first transport layer, and a second electrode layer coupled to the second transport layer. The second electrode layer has a third refractive index substantially matched to the first refractive index.

In an implementation of the second aspect, the second electrode layer includes at least one of Indium Tin Oxide (ITO) nanoparticles and silver nanowires.

In another implementation of the second aspect, the second material includes a high index transparent material including at least one of Indium Tin Oxide (ITO) and Indium Zinc Oxide (IZO).

In yet another implementation of the second aspect, at least two of the plurality of sub-pixel stacks have different distances between the emissive layer and the first electrode layer to maintain a substantially same angular distribution in the first material for emissions at different wavelengths.

In yet another implementation of the second aspect, the sub-pixel stack emits a first emission peak into the first material along an on-axis direction substantially normal to a top surface of the sub-pixel stack, the sub-pixel stack emits a second emission peak into the first material along an off-axis direction at an angle to the on-axis direction, and the second emission peak along the off-axis direction is reflected by an interface between the first material and the second material and directed onto a sloped sidewall of the bank.

In yet another implementation of the second aspect, the second emission peak is reflected by the sloped sidewall of the bank and emitted through the interface along the on-axis direction without substantial total internal reflection, and an angle between the sloped sidewall of the bank and the top surface of the sub-pixel stack is one-half an angle between the on-axis direction of the first emission peak and the off-axis direction of the second emission peak.

In yet another implementation of the second aspect, a top surface of the first material is coplanar with a top surface of the bank, and the second material covers the top surface of the first material in the interior space and the top surface of the bank surrounding each of the plurality of sub-pixel stacks.

In yet another implementation of the second aspect, the light emitting structure further comprises an air gap between the first material and the second material.

In yet another implementation of the second aspect, the emissive layer includes quantum dot emission material, the first transport layer includes a hole transport layer, the second transport layer includes an electron transport layer, the first electrode layer is an anode layer including a metallic reflector for reflecting the light emitted from the emissive layer, and the second electrode layer is a cathode layer including a non-metallic and substantially transparent material.

In yet another implementation of the second aspect, the emissive layer includes quantum dot emission material, the first transport layer includes an electron transport layer, the second transport layer includes a hole transport layer, the first electrode layer is a cathode layer having a metallic reflector for reflecting the light emitted from the emissive layer, and the second electrode layer is an anode layer having a non-metallic and substantially transparent material.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

FIG. 1A is a schematic cross-sectional view of a portion of an example light emitting structure in accordance with an example implementation of the present disclosure.

FIG. 1B is a schematic cross-sectional view of a portion of the sub-pixel stack in the light emitting structure of FIG. 1A in accordance with an example implementation of the present disclosure.

FIG. 3A illustrates a portion of a preferred example light emitting structure in accordance with an example implementation of the present disclosure.

FIG. 3B illustrates example angular distributions of a single emission peak at one wavelength as measured in the example light emitting structure of FIG. 3A in accordance with an example implementation of the present disclosure.

FIG. 4A is a schematic cross-sectional view of an example light emitting structure in accordance with an example implementation of the present disclosure.

FIG. 4B, FIG. 4C, and FIG. 4D are detailed schematic cross-sectional views of three example structures of three sub-pixel stacks in the light emitting structure of FIG. 4A in accordance with example implementations of the present disclosure.

DESCRIPTION

Figures 2A, 2B:
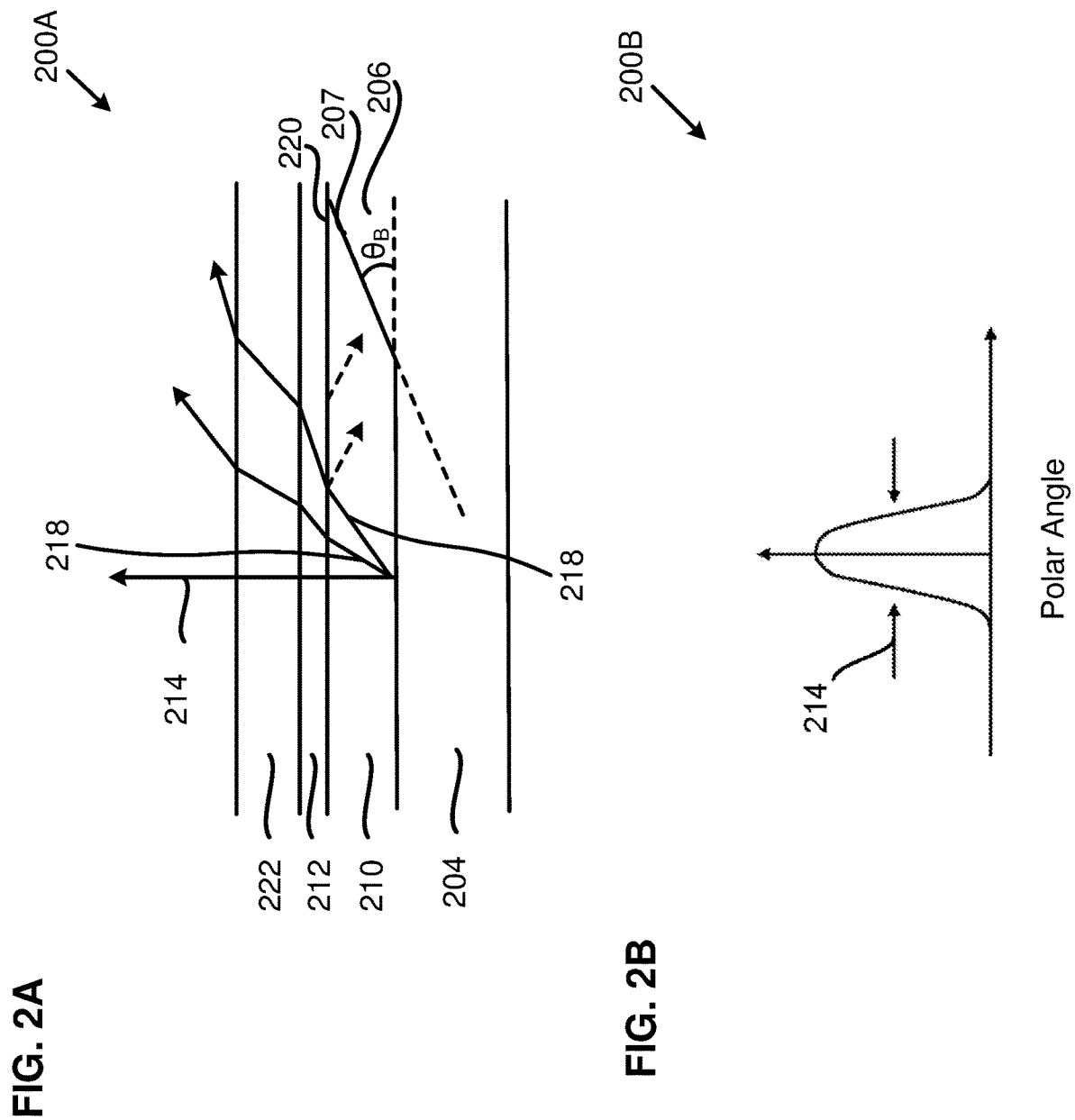
FIG. 2A illustrates a portion of a related art sub-pixel stack in a light emitting structure.
FIG. 2B illustrates an angular distribution diagram of a single emission peak at one wavelength as measured in the light emitting structure of FIG. 2A.

The following disclosure contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art.

Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purposes of consistency and ease of understanding, like features may be identified (although, in some examples, not shown) by the same numerals in the example figures. However, the features in different implementations may be differed in other respects, and thus shall not be narrowly confined to what is shown in the figures.

The description uses the phrases "in one implementation," or "in some implementations," which may each refer to one or more of the same or different implementations. The term "comprising" means "including, but not necessarily limited to" and specifically indicates open-ended inclusion or membership in the so-described combination, group, series and the equivalent. The expression "at least one of A, B and C" or "at least one of the following: A, B and C" means "only A, or only B, or only C, or any combination of A, B and C."

The descriptions use the phrase "optical distance" (or "optical thickness"), which may refer to a product of a reflective index of a material and an actual physical distance in the material (or an actual physical thickness of the material).

Additionally, for the purposes of explanation and non-limitation, specific details, such as functional entities, techniques, protocols, standards, and the like are set forth for providing an understanding of the described technology. In other examples, detailed description of well-known methods, technologies, systems, architectures, and the like are omitted so as not to obscure the description with unnecessary details.

The present disclosure relates to an emissive display involving a quantum dot electro-emissive material in a light emitting diode (LED) arrangement. Although one or more implementations of the present disclosure are described with reference to displays with QLED pixels, the example implementations provided herein do not limit the scope of the present disclosure and may also be applied in other displays and structures, such as OLED structures. The LED arrangement typically includes a layer of quantum dot (QD) emission material (e.g., emissive layer) sandwiched between an electron transport layer (ETL) and a hole transport layer (HTL). The three layers are sandwiched between two conductive layers to form a sub-pixel stack. In one or more implementations of the present disclosure, a "top" emitting (TE) structure is used. The TE structure involves light emission from a side of the TE structure opposite a glass substrate on which the TE structure is disposed.

In one or more implementations of the present disclosure, fabrication of a TE device involves one layer of conductive reflective material, typically, made of a metal (e.g., silver or aluminium) deposited on the glass substrate with the HTL layer on the conductive reflective layer (e.g., a reflective conductor or reflective electrode), the emissive layer on the HTL layer, the ETL layer on the emissive layer, and a transparent electrode layer on the ETL layer. In one preferred implementation, the reflective electrode has a thickness greater than 80 nm (i.e., 10^-9 meters). In another preferred implementation, the reflective electrode includes a layer of silver having a thickness of approximately 100 nm and a layer of ITO having a thickness of approximately 10 nm. In one preferred implementation, the HTL layer is made of a layer of PEDOT:PSS (poly(3,4-ethylenedioxythiophene) polystyrene sulfonate) approximately 40 nm thick and a layer of TFB (poly(9,9'-dioctylfluorene-co-bis-N,N'-(4-butylphenyl)diphenylamine)) having a thickness of approximately 35-45 nm on the PEDOT:PSS layer. In another preferred implementation, an approximately 20 nm thick emissive layer is disposed on the HTL layer and the ETL layer is disposed on the emissive layer. In another preferred implementation, the ETL layer is made of Zinc Oxide (ZnO) nanoparticles and has a thickness of approximately 30-80 nm. In one preferred implementation, the transparent electrode layer (e.g., a top electrode layer of the TE device) is a thin metal layer thick enough to carry sufficient current yet thin enough to be transparent to light and disposed on the ETL layer. In one preferred implementation, the transparent electrode layer is typically made of silver nanowires having a thickness of about 10-15 nm. In another preferred implementation, the transparent electrode layer is typically made of ITO nanoparticles or bulk ITO having a thickness of about 80-100 nm.

The present disclosure is not limited to the provided examples as the essential principle of the disclosed structure still applies if the arrangement of the ETL and HTL layers is reversed. In one preferred implementation of the present disclosure the transport layer is thinner than the transport layer disposed closer to the glass substrate regardless of whether the ETL layer or the HTL layer is disposed on the emitting side of the emissive layer away from the glass substrate.

In OLED panels, the use of semi-transparent thin metallic top electrodes (e.g., cathodes) is ubiquitous. The partial reflectivity of such electrodes with the fully reflective bottom electrode (e.g., anode) creates an optical cavity for extraction, which is strongly dependent on wavelength and direction of light. The OLED dyes used for the emissive layer have a broad phosphorescence spectrum. However, the red/green/blue dyes have a poor colour gamut range. Thus, it is necessary to design the transmission of a cavity to suppress many wavelengths, increasing gamut at the expense of lower optical efficiency. In addition, the direction dependence also introduces shifts in colour with angle, which may be undesirable.

In related art QLED panels, the quantum dot emissive layer may have a spectrum that is narrow enough for a good colour gamut; thus, the use of an optical cavity may not be required. Thus, it is possible to use a fully transparent non-metallic element for the top electrode (e.g., cathode), which may improve efficiency, but more specifically, reduce colour shift. The top electrode as described above is, for example, a cathode having a refractive index in the same order as the other layers, e.g., greater than approximately 1.7. However, such high refractive index transparent cathodes, such as ITO having a refractive index of 1.89 at 620 nm, are ceramics that require fabrication processes that are detrimental to the emissive layers for QLED. A more preferable transparent cathode has a lower refractive index, such as nanoparticle ITO that can be solution processed, for example with value of less than 1.45 at 620 nm. Such indices, however, create reflective boundaries with the emissive layers due to the mismatch of the index and waveguide modes, thus introducing reflections, which reintroduce cavity effects such as a loss of efficiency and colour shift. Further, with the use of a high index layer with a low index cathode (e.g., FIG. 2A), an angular distribution in the high index layer that will be very narrow in angle is created (e.g., FIG. 2B), which may allow little light subject to total internal reflection, thus significantly reducing the effects of light collimation and reduced colour shift by the bank.

In one or more implementations of the present disclosure, the related art structure of a high refractive index filler layer and a low refractive index layer disposed above the high refractive index filler layer as described above is inverted. Specifically, a high refractive index layer (e.g., ITO or Indium Zinc Oxide (IZO) having a refractive index of approximately 2.07 at 620 nm) is above a low refractive index filler that has a similar refractive index as the cathode (e.g., FIG. 3A). With such implementation of the present disclosure, an angular distribution in the low index layer that will be wider in angle is created (e.g., FIG. 3B). In other words, light at higher incident angles will be reflected to the bank for light collimation via Fresnel reflection, thus reducing colour shift. The low index layer or filler may be made of aerogel. Details of the implementations of the present disclosure are further discussed with the following figures and related descriptions.

In related art, a QLED sub-pixel structure includes an interior space structure (e.g., a cavity structure) that may be outlined by a sub-pixel stack having emissive layers and a bank structure surrounding the sub-pixel stack. The interior space structure above the emissive layers within the bank structure is a filler or an encapsulate material that protects the emissive layer. The filler material also extracts light from the emissive layers to a greater extent than air would do, due to its higher refractive index. Light trapped in the emissive layers is quickly absorbed but light trapped in the higher index filler layer has the chance to propagate to the bank edges and can be extracted by reflection. The bank is typically opaque and the surface towards the higher index filler layer can be scattering reflective or specular reflective. The higher index filler layer typically has a higher refractive index that may be disposed in the interior space structure above the sub-pixel stack. Above the higher index filler layer is typically air or a lower refractive index layer to prevent light from leaking into the neighbouring pixels via an upper glass layer disposed above the lower index layer and preventing cross-talk, and to enable the transfer to the bank edges by total internal reflection. The lower index layer traps light in the higher index filler layer that is more readily absorbed. Therefore, light can be extracted more effectively from the higher index filler layer without coupling light into the upper glass layer. Extracted light can then be propagated by reflection onto the bank, the reflected light improving collimation with a high on-axis brightness and mixing light of different angles, thus further reducing colour shift.

In one or more implementations of the present disclosure, the QLED sub-pixel structure differs from the related art QLED sub-pixel structure in that a lower refractive index filler layer (e.g., first material layer 110 in FIG. 1A) may be disposed in the interior space structure and a higher refractive index layer (e.g., second material layer 112 in FIG. 1A) may be disposed above the lower index filler layer that has a refractive index similar to (e.g., matches) that of a cathode in the emissive layer. In one or more implementations of the present disclosure, the bank structure may have a height that is, at least, the same as or higher than the lower index filler layer. In one or more implementations, the lower index filler layer may be at least one of an air gap, siloxane based nano-composite polymers from Inkron with refractive index as low as 1.15, Poly(1,1,1,3,3,3-hexafluoroisopropyl acrylate) with a refractive index of 1.375, and Poly(2,2,3,3,4,4,4-heptafluorobutyl acrylate) with a refractive index of 1.377.

In one or more implementations of the present disclosure, angular emission distributions from the emissive layer can be determined by an optical distance between the emissive layer and the reflective electrode layer (e.g., at the bottom of the sub-pixel stack) and the distance is directly dependent on a total optical thickness of the HTL layer. The distance between the emissive layer and the reflective electrode layer may be tuned such that there are two directions of light emissions from the light source where constructive interference occurs. One direction is an on-axis emission (e.g., emission normal to a plane, or a top surface, of the sub-pixel stack) and the other direction is an off-axis emission (e.g., emission is at an angle with respect to the on-axis direction).

In an example implementation where the reflective electrode is a perfect mirror, the reflective electrode layer is at an optical distance of a wavelength (e.g., λ) apart from the emissive layer. The optical distance may be 0.5, 1, or any integer with a multiple of 0.5 wavelength apart from the emissive layer. In an example implementation where the reflective electrode is not a perfect mirror (e.g., in other words a phase shift exists), a point of reflection will not be located exactly at the surface of the reflective electrode. In one or more implementations of the present disclosure, the reflective electrode is, for example, at an optical distance of about 1 wavelength apart from the emissive layer in order to generate two emissions (e.g., on-axis and off-axis emissions). However, in order to offset the effects of the phase shift in the reflective electrode, the distance is adjusted to 0.87 wavelength (such value is an example, the actual value is dependent on the material properties of the bottom reflector). The emissive layer may generate a constructive on-axis emission normal to the reflective electrode and an off-axis emission at approximately 50°-55° off-axis with respect to the on-axis emission such that an optical thickness of the HTL layer may be obtained.

The correlation described previously between the distance, thickness, angular emissions, and wavelength may be represented by the following equations:

$$2(d-d')\cos(\theta_P)=N\lambda \qquad \text{Equation (1)}$$

$$d=T \qquad \text{Equation (2)}$$

where d is a sum of all optical thicknesses of all layers (e.g., 104b1 and 104b2 in FIG. 1B) in the HTL layer, d' is an optical distance from a top surface of the reflective electrode to an interior portion of the reflective electrode where effective reflection takes place in compensation for a real phase shift (e.g., d' in FIG. 1B), $\theta_P$ is an angle between the on-axis emission and the off-axis emission (e.g., FIG. 1A), N is an integer greater than zero, λ is wavelength in free space, and T is a total optical thickness of the HTL layer which may include one or more layers (e.g., TFB layer and PEDOT:PSS layer) with each layer having a different refractive index. With Equations (1) and (2), the thickness T can be tuned accordingly. In an example implementation, N may equal to 1 to give a broad forward emission direction. In a preferred example implementation, N may equal to 2 if d is predetermined and $\theta_P$ is equal to 0 (e.g., d−d'=λ). As such, if cos($\theta_P$) is equal to ½ (e.g., $\theta_P$ is 60°), a second peak may be generated. Due to the difference in refractive indices between various elements (e.g., HTL layer, filler layer, etc.) of the present disclosure, $\theta_P$ is less than 60° in one preferred implementation, and $\theta_P$ is about 50°-55° in yet another preferred implementation). The term "emission" described in the present disclosure may refer to a distribution of wavelengths emitted, but is not limited to a single wavelength. The term "wavelength" in the present disclosure may be used to describe a peak or central wavelength amongst the plurality of wavelengths in the context of equations above, but is not limited to the description provided herein. The optical distance (thickness) is calculated as the product of the reflective index of the material and the actual physical distance (thickness) in the material.

The example implementations of the present disclosure may be related to QLED structures. However, the present disclosure is not limited only to QLED structures and may be applicable to various implementations related to OLED structures.

In the present disclosure with the interior space structure and the top transparent electrode, a distance between the emissive layer and the reflective electrode is tuned as described previously such that there are on-axis emissions and off-axis emissions. The off-axis emissions will be reflected onto the top surface (e.g., an interface) of the filler material via total internal reflection (TIR) at least once before being reflected off a sloped-surface of the bank and emitted through the filler material along the on-axis direction. The bank structure at ends of each pixel is designed such that a sloped angle of the bank structure (e.g., bank angle) is one-half an angle of an off-axis emission into the filler material relative to the on-axis emission.

In the present disclosure, the emissive layer in the sub-pixel stack may emit light in a range of wavelengths having one central wavelength that is typically taken as the main emission peak. The central wavelength is the wavelength of the highest spectral brightness in the emission spectrum from the light emission source. In the present disclosure, for wavelengths emitted by the emissive layer that are longer on average than the central wavelength, a stronger intensity off-axis emission than the on-axis emission is produced. The on-axis emission is stronger in intensity than the off-axis emission for wavelengths shorter than the central wavelength.

According to the present disclosure, on-axis brightness is maximized as well as the brightness perceived by the user even if total light output efficiency is not maximized. Since light of the on-axis emission is generally perceived by a user at a central area of a pixel and light of the off-axis emission is generally perceived at edges of a bank, a distribution of light from these different spectral areas may provide a more balanced colour distribution at all angles, thereby minimizing colour shift at various angles.

FIG. 1A is a schematic cross-sectional view of a portion of an example light emitting structure in accordance with an example implementation of the present disclosure. In FIG. 1A, an example light emitting structure 100 may include a substrate 102, a sub-pixel stack 104, a bank 106, a first material layer 110, a second material layer 112, and a glass cover 122. In one or more implementations of the present disclosure, the sub-pixel stack 104 may be disposed on the substrate 102 with the bank 106 surrounding the sub-pixel stack 104 to form an interior space 108 above the sub-pixel stack 104. The first material layer 110 may be a low refractive index material filled in the interior space 108, and the second material layer 112 may be a higher refractive index material relative to the first material layer 110 disposed above the first material layer 110. In one implementation, the example light emitting structure 100 may include a pixel structure. In one implementation, the second material layer 112 may be disposed continuously over the first material layer 110 and the bank 106. In one implementation, the second material layer 112 may cover an entire top surface of the first material layer 110. In one implementation, a top surface of the first material layer 110 is coplanar with a top surface of the bank 106, and the second material layer 112 covers the top surface of the first material layer 110 in the interior space 108 and the top surface of the bank 106 surrounding the sub-pixel stack 104.

In one or more implementations, the bank 106 may be greater in thickness than the thickness of the first material layer 110. In one or more implementations, the bank 106 is in contact with the substrate 102. In a preferred implementation, the bank 106 may be in contact or almost in contact with the second material layer 112. In one or more implementations, the glass cover 122 may be disposed continuously over the second material layer 112.

In one or more implementations, the bank 106 may be opaque. A surface of the bank 106 facing the first material layer 110 may be scattering reflective or specular reflective, and may be at an angle (e.g., sloped) with respect to the plane of the substrate 102 (e.g., a glass substrate).

In one or more implementations, light emissions such as a first emission peak 114 and a second emission peak 118 may be emitted from the sub-pixel stack 104. The first emission peak 114 is emitted from the sub-pixel stack 104 in an on-axis direction through the first material layer 110, the second material layer 112, and the glass cover 122. The second emission peak 118 is emitted from the sub-pixel stack 104 in an off-axis direction (e.g., at an angle) with respect to the on-axis direction. The second emission peak 118 emitting in the off-axis direction may be reflected onto an interface 120 (e.g., a top surface of the first material layer 110) via total internal reflection (TIR) at least once before being reflected off a sloped sidewall 107 of the bank 106 and emitted through the first material layer 110, the second material layer 112, and the glass cover 122 along the on-axis direction as an on-axis emission 116.

FIG. 1B is a schematic cross-sectional view of a portion of the sub-pixel stack in the light emitting structure of FIG. 1A in accordance with an example implementation of the present disclosure. As shown in FIG. 1B, the sub-pixel stack 104 includes a first electrode layer 104a, an HTL layer 104b, an emissive layer 104c, an ETL layer 104d, and a second electrode layer 104e.

In one or more implementations of the present disclosure, with reference to FIGS. 1A and 1B, the first material layer 110 with the lower refractive index relative to the second material layer 112 may be disposed on the second electrode layer 104e (e.g., the top electrode) of the sub-pixel stack 104 and the refractive index of the second electrode layer 104e may match (e.g., be similar to or the same as) the refractive index of the first material layer 110. In the present implementation, the first electrode layer 104a may be a bottom reflective electrode and the second electrode layer 104e may be a transparent top electrode. The first electrode layer 104a may be disposed on the substrate 102 and may be an anode layer that is a metallic reflector reflecting light emitted from the emissive layer 104c. The second electrode layer 104e may be a cathode layer that is non-metallic, substantially transparent, and disposed on the ETL layer 104d. In one or more implementations, the second electrode layer 104e maybe a low refractive index conducting material, for example, ITO nanoparticles or silver nanowires. In one or more implementations, the second electrode layer 104e (top electrode of the sub-pixel stack 104) may have a refractive index that is significantly lower than the refractive indices of the other layers of the sub-pixel stack 104.

However, the arrangement of the first electrode layer 104a and the second electrode layer 104e is not limited to the examples provided herein and may be reversed. For example, the first electrode layer 104a may be a top cathode layer that is non-metallic and substantially transparent and the second electrode layer 104e may be a bottom anode layer that is a metallic reflector reflecting light emitted from the emissive layer 104c.

As shown in FIG. 1B, the HTL layer 104b may include a TFB layer 104b1 and a PEDOT:PSS layer 104b2. In another implementation, the HTL layer 104b may include other layers and is not limited to the example layers provided herein. In another implementation, the previous arrangements of the HTL layer 104b and the ETL layer 104d may be reversed depending on the arrangements of the first electrode layer 104a and second electrode layer 104e.

With references to FIGS. 1A and 1B, the emission structure of the sub-pixel stack 104 can be used when bounded by the bank 106 (e.g., a high bank). The interior space 108 between the bank 106 and above the sub-pixel stack 104 is filled with the lower index first material layer 110 that matches (e.g., is similarly low or the same as) refractive index to the second electrode layer 104e (top electrode). In other words, the top surface of the second electrode layer 104e has a refractive index that matches the refractive index of first material layer 110 filling the interior space 108. Thus, while the thickness of the second electrode layer 104e does not significantly affect on the overall performance of the display, it may be important in minimizing resistive losses and variation in processing. In addition, light reflection from the top surface of the second electrode layer 104e is minimized. Accordingly, most of the light emitted from the emissive layer 104c that may pass through the second electrode layer 104e at the top of the sub-pixel stack 104 will pass through with minimal reflection.

In one or more implementations, the second material layer 112 is a continuous high index layer that may be a high index transparent material such as ITO or IZO, and covers entirely over the first material layer 110 with a relatively lower index. With the higher index second material layer 112 above the lower index first material layer 110, off-axis emissions from the sub-pixel stack 104 may be converted into Fresnel reflections (total internal reflections), be further directed onto the bank 106, and be collimated into emissions in an on-axis direction, which can be merged or mixed back with a majority of on-axis emissions from the sub-pixel stack 104 in the on-axis direction (e.g., the z-direction), thus improving on-axis brightness. Specifically, with reference to FIGS. 1A and 1B, at least one single emission peak is produced from the sub-pixel stack 104. With reference to FIG. 1A, a first emission peak 114 may be produced from the sub-pixel stack 104. The first emission peak 114 may be an on-axis emission that is emitted from the emissive layer 104c, normal to a top surface of the emissive layer 104c, through the ETL layer 104d, the second electrode layer 104e, and then through the first material layer 110 (e.g., lower index), the second material layer 112 (e.g., higher index), and the glass cover 122 substantially without total internal reflection.

In one or more implementations of the present disclosure, with reference to FIGS. 1A and 1B, the second emission peak 118 may be an off-axis emission emitted from the emissive layer 104c and into the first material layer 110 at an off-angle with respect to the first emission peak 114. The off-axis second emission peak 118 may reflect totally and internally at an interface 120 (e.g., the top surface of the first material layer 110) at least once as a total internal reflection (TIR), before reaching the sloped sidewall 107 of the bank 106. The off-axis second emission peak 118 undergone total internal reflection may reflect off the sloped sidewall 107 along the on-axis direction (e.g., at an angle that is normal to the top surface of the emissive layer 104c) and through the interface 120 substantially without total internal reflection as an on-axis emission 116.

In one or more implementations, the first emission peak 114 may be emitted through the interface 120 substantially without total internal reflection. In a preferred implementation, a bank angle $\theta_B$ of the sloped sidewall 107 or an angle between the sloped sidewall 107 of the bank 106 and the top surface of the sub-pixel stack 104 is one-half an off-axis second emission angle $\theta_P$ with respect to the on-axis first emission peak 114. With such arrangement, the reflective slope angle $\theta_B$ of the bank 106 may be tuned to optimize for a high on-axis brightness.

FIG. 2A illustrates a portion of a related art sub-pixel stack in a light emitting structure. FIG. 2B illustrates an angular distribution diagram of a single emission peak at one wavelength as measured in the light emitting structure of FIG. 2A.

In FIG. 2A, the related art light emitting structure 200A may include a substrate (not explicitly shown), a sub-pixel stack 204, a first material layer 210, a bank 206 having a sloped sidewall 207 surrounding the sub-pixel stack 204 and the first material layer 210 (dotted line), a continuous second material layer 212 covering the entire first material layer 210 and the bank 206, and a glass cover 222 covering the second material layer 212 that may correspond to the substrate 102, the sub-pixel stack 104, the first material layer 110, the bank 106 surrounding the sub-pixel stack 104 and the first material layer 110, the continuous second material layer 112 covering the entire first material layer 110 and the bank 106, and the glass cover 122 covering the second material layer 112 of the example light emitting structure 100. However, the example light emitting structure 100 of the present disclosure differs from the related art light emitting structure 200A in that the related art light emitting structure 200A may include the first material layer 210 that has a higher refractive index relative to the refractive index of the second material layer 212 while the example light emitting structure 100 of the present disclosure may include the first material layer 110 that has a lower refractive index relative to the second material layer 112, and the second electrode layer 104e of the sub-pixel stack 104 has a refractive index matching (e.g., similar to) the refractive index of the lower index first material layer 110.

The structure 200A in FIG. 2A may include the sub-pixel stack 204 having a first electrode layer (not explicitly shown) that may be a reflective bottom electrode layer, a second electrode layer that may be a transparent top electrode layer (not explicitly shown), and the interface 220 (e.g., a surface of the first material layer 210). As described above, a single main emission peak may be produced by the emissive layer of the sub-pixel stack 204. A first emission peak 214 in an on-axis direction may pass through the first material layer 210 and second material layer 212 while a second emission peak 218 in an off-axis direction may spread in various angles which leads to lower on-axis brightness.

If the top electrode layer of the sub-pixel stack 204 (not explicitly shown) is an electrode with a low refractive index, the range of angles that can propagate through the low index top electrode of the sub-pixel stack 204 into the high index first material layer 210 is limited (e.g., FIG. 2A). For example, in the sub-pixel stack 204, the refractive index of the low index top electrode layer may be notated by $n_t$, the refractive index of the emitting layer may be notated by $n_e$, the refractive index of the high index first material layer 210 may be notated by $n_f$, then the maximum angle from the axis (e.g., an axis normal to the top surface of the low index top electrode layer) that can propagate in the low index top electrode layer, notated by $\theta_t$, may be derived by the following equation (3):

$$\sin \theta_t = n_t/n_e \qquad \text{Equation (3);}$$

and the maximum angle from the axis (e.g., an axis normal to the top surface of the first material layer 210) that can propagate in the first material layer 210 (e.g., filler), notated by $\theta_f$, may be derived from the following equation (4) according to Snell's Law:

$$\sin \theta_f = n_t/n_f \qquad \text{Equation (4).}$$

For the structure 200A, typical values of $n_t$ may be 1.4, $n_e$ may be 1.766, and $n_f$ may be 1.82. Thus, $\theta_f$ may be about 50°. Thus, all light propagates in the high index first material layer 210 at an angle less than 50° to the normal. The low index second material layer typically has a refractive index ($n_{LI}$) of 1.26, with which the angle of total internal reflection can be calculated to be about 43° (e.g., $\arcsin(n_{LI}/n_f)$). Thus, little light is reflected and the bank does little to improve the performance.

With reference to a diagram 200B in FIG. 2B, angular distribution of the first emission peak 214 in the on-axis direction at one wavelength is measured in the high index first material layer 210 (e.g., filler) of the structure 200A in FIG. 2A. The angular distribution of the first emission peak 214 in the on-axis direction in the high index first material layer 210 is very narrow in angle, which may allow little light subject to total internal reflection, thus significantly reducing the effects of collimation and reduced colour shift provided by the bank.

FIG. 3A illustrates a portion of a preferred example light emitting structure in accordance with an example implementation of the present disclosure. FIG. 3B illustrates an example angular distribution of a single emission peak at one wavelength as measured in the example light emitting structure of FIG. 3A in accordance with an example implementation of the present disclosure.

In FIG. 3A, the preferred example light emitting structure 300A may be substantially similar to that of the example light emitting structure 100 in FIG. 1A. Thus, the example light emitting structure 300A may include a substrate (not explicitly shown), a sub-pixel stack 304, a first material layer 310, a bank 306 having a sloped sidewall 307 surrounding the sub-pixel stack 304 and the first material layer 310, a continuous second material layer 312 covering the entire first material layer 310 and the bank 306, and a glass cover 322 covering the second material layer 312 that may corresponding to the substrate 102, the sub-pixel stack 104, the first material layer 110, the bank 106 surrounding the sub-pixel stack 104 and the first material layer 110, the continuous second material layer 112 covering the entire first material layer 110 and the bank 106, and the glass cover 122 covering the second material layer 112 of the example light emitting structure 100. Therefore, the details of the example light emitting structure 300A are omitted for brevity.

Similar to the light emitting structure in FIG. 1A, the example light emitting structure 300A in FIG. 3A of the present disclosure differs from the related art light emitting structure 200A in FIG. 2A in that the structure 200A may include the first material layer 210 that has a higher refractive index relative to the refractive index of the second material layer 212 while the example light emitting structure 300A of the present disclosure may include the first material layer 310 that has a lower refractive index relative to the second material layer 312, and the top electrode (not explicitly shown) of the sub-pixel stack 304 has a refractive index matching (e.g., similar to or the same as) the refractive index of the low index first material layer 310.

In the example light emitting structure 300A, an on-axis first emission peak 314 may be emitted from the sub-pixel stack 304. Off-axis emissions 318 may also be emitted from the sub-pixel stack 304. Most of the off-axis emissions 318 are totally reflected internally 318a at least once against an interface 320 (e.g., a plane between the low index first material layer 310 and the high index second material layer 312) via total internal reflection (TIR) before being reflected off the sloped sidewall 307 at an angle that is normal to a top surface of the sub-pixel stack 304 as light emissions in the on-axis direction 316.

With the arrangement of the low index first material layer 310, the high index second material layer 312, and the refractive index of the top electrode of the sub-pixel stack 304 matching (e.g., being similar to or the same as) the refractive index of the low index first material layer 310 as described above in FIG. 3A, the range of angles in the low index first material layer 310 is wide because light that can propagate through the low index top electrode of the sub-pixel stack 304 is not restricted. Thus, the angle range may be up to 90°, though more preferably, the angle range may be reduced at higher angles. When light reaches the high index second material layer 312, light would propagate through without total internal reflection. With a high enough refractive index, $n_{HI}$, in the second material layer 312, the totally internal reflections may be represented by two Fresnel's equations as follow (where S and P are polarization vectors):

$$R_s = \left| \frac{n_1 \cos \theta_i - n_2 \sqrt{1 - \left(\frac{n_1}{n_2}\sin \theta_i\right)^2}}{n_1 \cos \theta_i + n_2 \sqrt{1 - \left(\frac{n_1}{n_2}\sin \theta_i\right)^2}} \right|^2 ; \text{and} \quad \text{Equation (5)}$$

$$R_p = \left| \frac{n_1 \sqrt{1 - \left(\frac{n_1}{n_2}\sin \theta_i\right)^2} - n_2 \cos \theta_i}{n_1 \sqrt{1 - \left(\frac{n_1}{n_2}\sin \theta_i\right)^2} + n_2 \cos \theta_i} \right|^2 ; \quad \text{Equation (6)}$$

where $n_1$ ($n_f$) is the refractive index of the first material layer (e.g., first material layer 210 in FIG. 2A, or first material layer 310 in FIG. 3A), $n_2$ may be the refractive index of the second material layer (e.g., $n_{HI}$ for 312) that is higher relative to the first material layer (e.g., first material layer 310) or may be the refractive index of the second material layer (e.g., $n_{LI}$ for 212) that is lower relative to the first material layer (e.g., first material layer 210), and $\theta_i$ is the angle of incidence on the high index material layer (e.g., second material layer 212 in FIG. 2A or second material layer 312 in FIG. 3A). The total reflection is the average of the two equations above.

For the related art structure 200A in FIG. 2A, where the first material layer 210 has a higher index than the second material layer 212, if $\theta_i$ is equal to 0° and the angles up to 50°, $n_t$ is equal to 1.4, $n_{LI}$ is equal to 1.26, $n_f$ is equal to 1.82, and reflectivity is less than 3% on axis and only significant (greater than 8%) for angles greater than 37.5°. Thus, Fresnel reflections are less significant and TIR dominates the small angle range between 43° and 50°, where the light intensity is smallest. In addition, a shallow bank angle of 20° would be required to utilize such light, thus more area in the X-Y plane would be required for a non-emitting bank given a provided bank height.

However, for the example light emitting structure 300A in FIG. 3A of the present disclosure where the first material layer 310 has a lower index than the second material layer 312, $n_t$ is equal to 1.4, $n_{HL}$ is equal to 2.07, $n_f$ is equal to 1.4, and Fresnel reflectivity is less than 4% on axis but there is significant amount of light (>70°) off axis where Fresnel reflectivity is greater than 15% and higher at higher angles. A bank angle that is half of an angle of 35° would lead to collimation via the Fresnel reflections at the interface (e.g., 320), thus improving collimation and reducing colour shift. In the present implementation, the higher bank angle may result in less area in the X-Y plane being required for a bank given the same bank height as that employed in related art structure 200A.

With reference to a diagram 300B in FIG. 3B, angular distribution of the first emission peak 314 in the on-axis direction at one wavelength is measured in the low index first material layer 310 (e.g., filler layer). The angular distribution of the first emission peak 314 in the on-axis direction in the low index first material layer 310 is relatively broad in angle, which may allow more light subject to total internal reflection and different from the diagram 200B in FIG. 2B, thus significantly increasing the effects of light collimation and reduced colour shift provided by the bank 306.

FIG. 4A is a schematic cross-sectional view of an example structure 400A of a light emitting structure in accordance with an example implementation of the present disclosure. The example structure 400A in FIG. 4A includes a glass substrate 402, a sub-pixel stack 404, a bank 406, a first material layer 410, a second material layer 412, and a glass cover 422. The example structure 400A may substantially correspond to the example light emitting structure 100 described in FIG. 1A and the example light emitting structure 300A described in FIG. 3A. Therefore, the details of the example structure 400A are omitted for brevity.

In FIG. 4A, the example structure 400A differs from the example light emitting structure 100 in FIG. 1A and the example light emitting structure 300A in FIG. 3A in that the example structure 400A may include three light emitting structures 400B, 400C, and 400D (e.g., three sub-pixel stacks) for three different pixels. In one or more implementations of the present disclosure, the example structure 400A may include the example light emitting structure 400B for a blue pixel, the example light emitting structure 400C for a green pixel, and the example light emitting structure 400D for a red pixel. In another implementation, the example structure 400A may include more than three example structures for more than three pixels, and is not limited to the examples described herein.

In one or more implementations, a first emission peak 414 may be emitted in the on-axis direction through the first material layer 410, the second material layer 412, and the glass cover 422 substantially without total internal reflection. A second emission peak 418 may be emitted from the sub-pixel stack 404 at an off-axis direction towards an interface 420 (e.g., a top surface of the first material layer 410) between the first material layer 410 and the second material layer 412 and is totally internally reflected by the interface 420 at least once before being reflected from a sloped sidewall 407 of the bank 406 along the on-axis direction substantially without total internal reflection as an on-axis emission 416.

FIGS. 4B, 4C, and 4D are detailed schematic cross-sectional views of three example light emitting structures 400B, 400C, and 400D of three sub-pixel stacks (e.g., three dotted circles) in the light emitting structure of FIG. 4A in accordance with an example implementation of the present disclosure. The example light emitting structures 400B-400D are example sub-pixel stacks 404 each including a first electrode layer 404a, a HTL layer 404b including a TFB layer 404b1 and a PEDOT:PSS layer 404b2, an emissive layer 404c, an ETL layer 404d, and a second electrode layer 404e. The example structures 400B-400D may substantially correspond to the sub-pixel stack 104 described in FIG. 1B. Therefore, the details of the example structures 400B, 400C, and 400D are omitted for brevity.

The three example light emitting structures 400B-400D are sub-pixel stacks 404 for three colour pixels (e.g., blue, green, and red pixels, respectively). The distance between an emissive layer and a reflective electrode at the bottom of the emitting structure, or a thickness of the HTL layer, may be tuned such that the constructive on-axis first emission peak 414 and the off-axis second emission peak 418 are emitted.

In one or more implementations, the TFB layers 404b1 of the three example light emitting structures 400B-400D (e.g., sub-pixel stacks) have different thicknesses such that tuning the thickness t (e.g., $t_B$, $t_G$, and $t_R$) of each of the TFB layers 404b1 may alter the relative intensities of the first emission peak 414 and the second emission peak 418 in each of the example light emitting structures 400B-400D. Therefore, the overall brightness is adjusted and colour shift is reduced.

In one example implementation, the thickness $t_B$ of the TFB layer 104b1 in the example light emitting structure 400B for the blue pixel (emitting a central wavelength at about 435 nm) is about 75 nm, the thickness $t_G$ of the TFB layer 104b1 in the example light emitting structure 400C for the green pixel (emitting a central wavelength at about 530 nm) is about 115 nm, and the thickness $t_R$ of the TFB layer 104b1 in the example light emitting structure 400D for the red pixel (emitting a central wavelength at about 620 nm) is about 150 nm. In a preferred implementation, the thickness or the distance between the emissive layer 404c and the first electrode layer 404a is about 0.53 of a wavelength for each of the blue, green, and red pixels when refractive index is considered. The offset between the distances of the preferred implementation (where distance is 0.53) and an ideal implementation (where distance is 0.78) results from the reflective electrodes used. In the example implementation, the example light emitting structures 400B, 400C, and 400D respectively shown in FIGS. 4B, 4C, and 4D vary in thickness in only one of the layers (e.g., the TFB layer 404b1) of the HTL layer 404b. However, in one or more implementations of the present disclosure, any or all layers of the HTL layer 404b may vary in thickness such that a total optical thickness is the same as the total optical thickness if only one of the layers of the HTL layer 404b changes in thickness. The actual thickness of the HTL layer 404b in each of the three light emitting structures 400B, 400C, 400D with three different colours vary in order to maintain the same angular distribution in the low index first material layer 410 (e.g., filler layer) for the different wavelengths (e.g., colours) of the emission.

Figure 5:
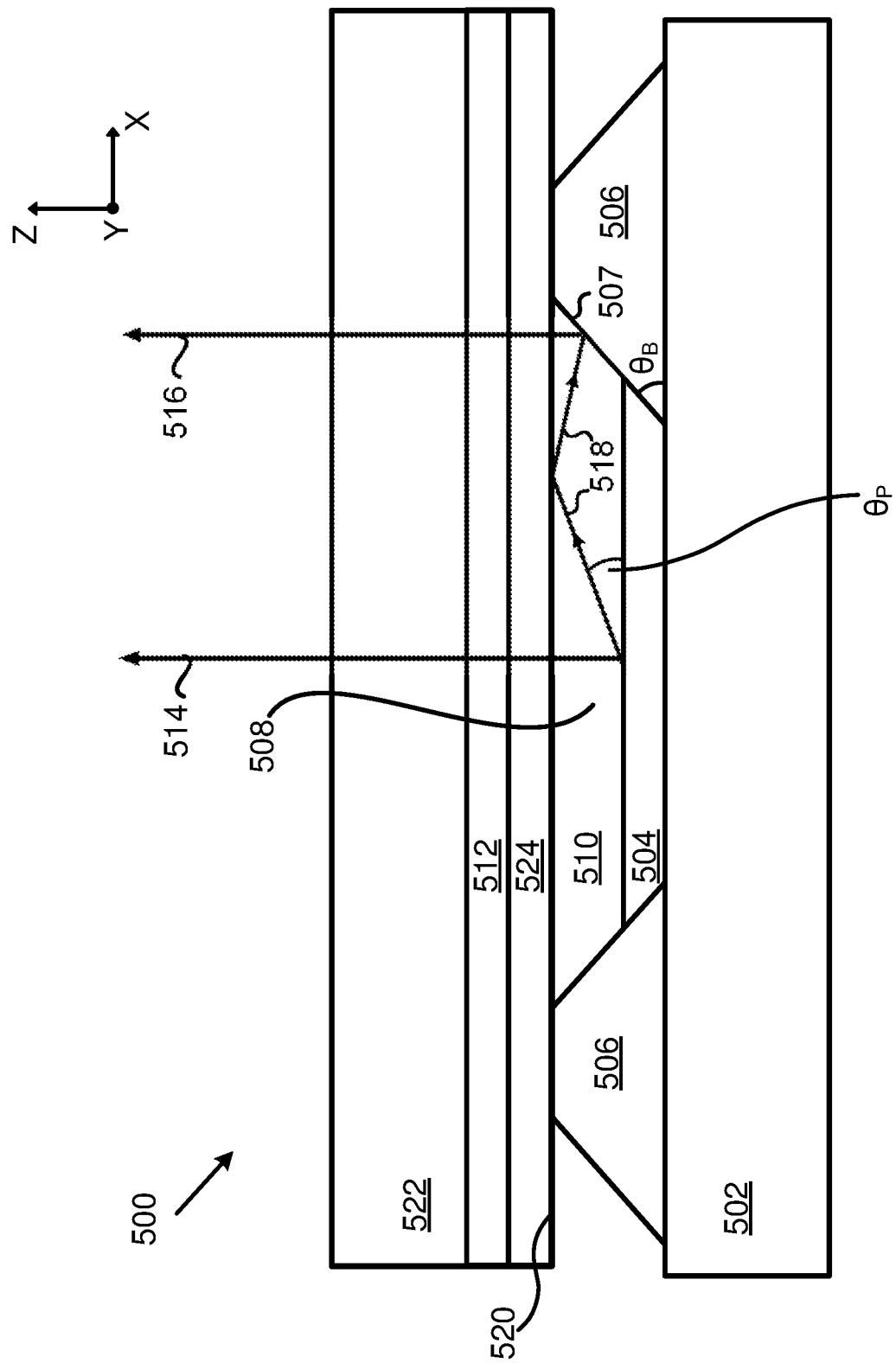
FIG. 5 is a schematic cross-sectional view of another example light emitting structure in accordance with an example implementation of the present disclosure.

FIG. 5 is a schematic cross-sectional view of another example structure 500 of a light emitting structure in accordance with an example implementation of the present disclosure. The example structure 500 includes a glass substrate 502, a sub-pixel stack 504, a bank 506, a first material layer 510 (e.g., a filler), a second material layer 512, and a glass cover 522. The example structure 500 may substantially correspond to the example light emitting structure 100 described in FIG. 1A, the example light emitting structure 300A described in FIG. 3A, and the example structure 400A described in FIG. 4A. Therefore, the details of the example structure 500 are omitted for brevity.

In one or more implementations, the example structure 500 differs from the example light emitting structure 100 in FIG. 1A, the example light emitting structure 300A described in FIG. 3A, and the example structure 400A described in FIG. 4A in that the example structure 500 has an air gap 524 between the low index first material layer 510 and the high index second material layer 512 to introduce more total internal reflections into the example structure 500 and also maximize Fresnel reflections from the lower surface of the high index second material layer 512. Consequently, use of the air gap 524 may result in improved overall efficiency, reduced colour shift, and improved on-axis brightness. Specifically, the first emission peak 514 may be emitted from the sub-pixel stack 504 through an interface 520 and the glass cover 522 along the on-axis direction in a central region of the example structure 500. The second emission peak 518 may be emitted from the sub-pixel stack 504 at an off-axis direction and be reflected by the interface 520 at least once via total internal reflection before reaching a sloped sidewall 507 of the bank 506, and be emitted through the interface 520 along the on-axis direction at the peripheral portions of first material layer 510 immediately proximate to the sloped sidewall 507 as an on-axis emission 516. These total internal reflections lead to higher efficiency, increase in on-axis brightness, and reduction in off-axis colour shift at various angles.

In one or more implementations, the second material layer 512 having higher refractive index may cover the entire air gap 524, and the air gap 524 may cover an entire top surface of the first material layer 510 (e.g., a plane parallel to the X-Y plane) having a lower refractive index except for peripheral portions of the first material layer 510 immediately proximate the bank 506.

In another implementation, the second material layer 512 may only cover a surface area substantially over a central portion of the first material layer 510. The physical arrangement(s) of the second material layer 512 with respect to the first material layer 510 is not limited to the example arrangements. The second material layer 512 may partially cover the first material layer 510 in another manner not described.

From the present disclosure, it can be seen that various techniques may be used for implementing the concepts described in the present disclosure without departing from the scope of those concepts. While the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present disclosure is not limited to the particular implementations described but rather many rearrangements, modifications, and substitutions are possible without departing from the scope of the present disclosure.

What is claimed is:

1. A light emitting structure comprising:
   a substrate;
   a plurality of sub-pixel stacks emitting different colours over a surface of the substrate, at least one of the plurality of sub-pixel stacks comprising:
      an emissive layer between a first transport layer and a second transport layer;
      a first electrode layer coupled to the first transport layer; and
      a second electrode layer coupled to the second transport layer;
   a bank surrounding each of the plurality of sub-pixel stacks and forming an interior space above each of the plurality of sub-pixel stacks;
   a first material filling the interior space and having a first refractive index; and
   a second material over the first material and having a second refractive index substantially higher than the first refractive index;
   wherein the second electrode layer has a third refractive index substantially matched to the first refractive index,
   wherein a top surface of the first material is coplanar with a top surface of the bank, and the second material covers the top surface of the first material in the interior space and the top surface of the bank surrounding each of the plurality of sub-pixel stacks.

2. The light emitting structure of claim 1, wherein the second electrode layer includes at least one of Indium Tin Oxide (ITO) nanoparticles and silver nanowires.

3. The light emitting structure of claim 1, wherein the second material includes a high index transparent material including at least one of Indium Tin Oxide (ITO) and Indium Zinc Oxide (IZO).

4. The light emitting structure of claim 1, wherein:
   at least two of the plurality of sub-pixel stacks have different distances between the emissive layer and the first electrode layer to maintain a substantially same angular distribution in the first material for emissions at different wavelengths.

5. The light emitting structure of claim 1, wherein:
   the sub-pixel stack emits a first emission into the first material along an on-axis direction substantially normal to a top surface of the sub-pixel stack;
   the sub-pixel stack emits a second emission into the first material along an off-axis direction at an angle to the on-axis direction; and
   the second emission along the off-axis direction is reflected by an interface between the first material and the second material and directed onto a sloped sidewall of the bank.

6. The light emitting structure of claim 5, wherein:
   the second emission is reflected by the sloped sidewall of the bank and emitted through the interface along the on-axis direction without substantial total internal reflection; and
   an angle between the sloped sidewall of the bank and the top surface of the sub-pixel stack is one-half an angle between the on-axis direction of the first emission and the off-axis direction of the second emission.

7. The light emitting structure of claim 1, wherein:
   the emissive layer includes quantum dot emission material;
   the first transport layer includes a hole transport layer;
   the second transport layer includes an electron transport layer;
   the first electrode layer is an anode layer including a metallic reflector for reflecting the light emitted from the emissive layer; and
   the second electrode layer is a cathode layer including a non-metallic and substantially transparent material.

8. The light emitting structure of claim 1, wherein:
   the emissive layer includes quantum dot emission material;
   the first transport layer includes an electron transport layer;
   the second transport layer includes a hole transport layer;
   the first electrode layer is a cathode layer having a metallic reflector for reflecting the light emitted from the emissive layer; and
   the second electrode layer is an anode layer having a non-metallic and substantially transparent material.

* * * * *